United States Patent
Takagi et al.

[11] Patent Number: 6,147,439
[45] Date of Patent: Nov. 14, 2000

[54] PIEZOELECTRIC SUBSTRATE SUPPORTING STRUCTURE FOR PIEZOELECTRIC TRANSFORMER AND PIEZOELECTRIC TRANSFORMER PROVIDED THEREWITH

[75] Inventors: Shusaku Takagi, Sodegaura; Masamitsu Tanaka, Ichihara; Sigeru Bando; Tadao Sunahara, both of Osawano-machi; Katsuo Kono, Hamamatsu; Mitsunobu Yoshida; Yasushi Iwata, both of Sodegaura, all of Japan

[73] Assignee: Mitsui Chemicals, Inc., Tokyo, Japan

[21] Appl. No.: 09/102,673

[22] Filed: Jun. 23, 1998

[30] Foreign Application Priority Data

Jul. 10, 1997 [JP] Japan ................................ 9-185499

[51] Int. Cl.⁷ ........................ H01L 41/053; H01L 41/047
[52] U.S. Cl. ........................................ 310/365; 310/348
[58] Field of Search .................... 310/363–365, 310/345, 348

[56] References Cited

U.S. PATENT DOCUMENTS

| | | | |
|---|---|---|---|
| 3,836,794 | 9/1974 | Shimizu et al. | 310/354 |
| 3,885,173 | 5/1975 | Lee | 310/313 B |
| 5,604,667 | 2/1997 | Morimoto | 361/760 |
| 5,739,679 | 4/1998 | Takehara et al. | 323/299 |

FOREIGN PATENT DOCUMENTS

| | | | |
|---|---|---|---|
| 0847093A | 6/1998 | European Pat. Off. | H01L 41/087 |
| 55-100719 | 7/1980 | Japan | H03H 9/10 |
| 7-79029 | 3/1995 | Japan | H01L 41/107 |
| 832135 | 2/1996 | Japan | H01L 41/107 |
| 8-125246 | 5/1996 | Japan | H01L 41/107 |
| 8-298213 | 11/1996 | Japan | H01F 27/02 |
| 09246618A | 9/1997 | Japan | H01L 41/107 |

OTHER PUBLICATIONS

Shin–Etsu Connectors—MAF Type, www.shinetsupolymer.com/maftype.html, 1997.
Piezoelectric Inverter for Cold–Cathode Fluorescent Lamps, www.tokin.com/Tokin_America_Products/37/p39/p39.htlm, Sep. 24, 1999.
TK75030M Type of Piezoelectric Inverter IC, www.toko.co.jp/newusa/np990215.html, Feb. 15, 1999.
TPU207 Series of for New Piezoelectric Inverter Unit, www.toko.co.jp/newusa/np981217.html, Dec. 17, 1998.

*Primary Examiner*—Thomas M. Dougherty
*Attorney, Agent, or Firm*—Birch, Stewart, Kolasch & Birch, LLP

[57] ABSTRACT

A piezoelectric substrate supporting structure for piezoelectric transformer is provided which, in the supporting and fixing of a piezoelectric substrate on a base plate or in an outer trim case, does not inhibit the vibration of the piezoelectric substrate, exhibits high impact resistance and enables stable supporting, is free from performance deterioration and enables simultaneously and easily performing an electrode takeoff from the piezoelectric substrate. Further, a piezoelectric transformer including the above piezoelectric substrate supporting structure is provided.

The above piezoelectric substrate supporting structure for piezoelectric transformer comprises a piezoelectric substrate 30 as a constituent of piezoelectric transformer 20, which is fitted with electrodes, and conductive supporting members 10A to 10C interposed between portions of the piezoelectric substrate electrodes 34A to 34D and portions of conductive parts 50, 60 disposed on a mounted member 22, 24 for securing the piezoelectric substrate 30, wherein the conductive supporting members are composed of an elastic nonmetal material and a conductive material. Each of the conductive supporting members has its internal part or surface provided with cavities.

6 Claims, 10 Drawing Sheets

PIEZOELECTRIC SUBSTRATE SUPPORTING STRUCTURE FOR PIEZOELECTRIC TRANSFORMER AND PIEZOELECTRIC TRANSFORMER PROVIDED THEREWITH

FIELD OF THE INVENTION

The present invention relates to a piezoelectric substrate supporting structure for piezoelectric transformer, which secures a piezoelectric substrate to, for example, a piezoelectric substrate accommodating outer trim case and a piezoelectric substrate fixing plate so that the piezoelectric substrate is supported and fixed and so that electrode takeoff from the piezoelectric substrate can be carried out. The present invention also relates to a piezoelectric transformer including the above piezoelectric substrate supporting structure.

BACKGROUND OF THE INVENTION

In recent years, it has become necessary to miniaturize electronic parts and reduce the thickness thereof without inviting deterioration in the performance and quality over conventional electronic parts in accordance with the miniaturization of electronic equipment such as portable information terminals and portable communication devices. This also applies to piezoelectric parts such as a piezoelectric resonator, a piezoelectric transformer, a piezoelectric gyro, a piezoelectric buzzer and a piezoelectric actuator. In particular, with respect to energy confining type resonance utilizing piezoelectric resonators, a thin surface-mountable resonator has been developed. In this case, the support and fixing of the resonator has been carried out by directly mounting a piezoelectric substrate provided with an exciting electrode on an electrode formed on a base plate, without the use of any support, and effecting a bonding by means of a conductive cement.

With respect to resonance vibration utilizing parts other than the piezoelectric resonator, such as a piezoelectric transformer, a piezoelectric gyro, a piezoelectric buzzer or a piezoelectric actuator, the following method for supporting and fixing of the piezoelectric substrate thereof is proposed. Namely, the support and fixing of the piezoelectric substrate thereof is carried out by arranging a stringy rubber-made elastic body or the like on a line (surface) along nodal points of resonance vibration occurring in the direction of vibration of the piezoelectric substrate so as not to inhibit resonance vibration. In addition, a lead terminal is soldered on an exciting electrode provided on the piezoelectric substrate so that removing the electrode can be attained (see Japanese Patent Laid-open Publication No. 8(1996)-32135). The "exciting electrode" refers to the electrode to vibrate the piezoelectric vibrating element by exerting alternating current voltages to the piezoelectric vibrating elements. Furthermore, another method has been proposed in which a lead terminal is a metal spring is elastically bonded to the piezoelectric substrate so that the support and fixing thereof and the electrode taking-off are simultaneously carried out (see Japanese Patent Laid-open Publication No. 8(1996)-298213). Further, a structure has been proposed in which a spring piece is interposed between a piezoelectric substrate accommodating a cage-shaped outer trim case and a piezoelectric substrate. The spring piece protrudes from the outer trim case so as to use it as an input terminal (see Japanese Patent Laid-open Publication No. 7(1995)-079029).

Generally, the above piezoelectric parts are often assembled in portable devices which are used in dynamic conditions, so that it is demanded that the impact resistance and frequency temperature characteristic thereof be maintained well.

However, in the above supporting fixing method comprising bonding a piezoelectric substrate onto a base plate by means of a conductive cement, the temperature dependent expansion coefficient is different between the piezoelectric substrate and the base plate. As a result, upon the occurrence of a temperature change, the piezoelectric substrate comes to have a stress, thereby inviting the danger that the frequency characteristic is changed. Further, in this method, the bonding is conducted without the use of a cushioning material, so that, when a strong bonding to the base plate is conducted for improving the impact resistance, the frequency temperature characteristic thereof is unfavorably deteriorated.

On the other hand, in the above method of effecting the supporting and fixing by means of a rubber-made elastic body, a metal spring or a spring piece, such a supporting position, supporting method, driving method and electrode takeoff method as will not inhibit the vibration of the piezoelectric substrate are required. Therefore, this causes a problem of securing the performance of piezoelectric parts such as a piezoelectric actuator, a piezoelectric gyro, a piezoelectric transformer or a piezoelectric buzzer which is used in a large-amplitude resonance vibration of the piezoelectric substrate.

Moreover, in the supporting and fixing in which the rubbery elastic body is used, for attaining an electrical connection with the piezoelectric substrate, it is required to separately solder a lead terminal onto an exciting electrode to thereby take off an electrode. Further, in this method, even when the support by means of the stringy elastic body is performed on the line along the nodal points of resonance vibration occurring in the direction of excitation of the piezoelectric substrate, the displacement of piezoelectric substrate in the directions other than the excitation direction which occurs by the resonance vibration is inhibited to thereby inhibit the resonance vibration. Other methods are also applicable which include one employing a wire or another comprising elastically bonding a pin. In all of these methods, the number of parts is increased and the assembly work is complicated to thereby bring about problems of productivity and cost.

Therefore, for securely supporting the piezoelectric substrate by means of the elastic body, it is contemplated to expand the width of the elastic body and the area of contact thereof with the piezoelectric substrate. However, this leads to an increase of the area of the upper surface of piezoelectric substrate covered by the elastic body, so that, unfavorably, not only the mechanical vibration of the piezoelectric substrate is inhibited but also the miniaturization of the piezoelectric part becomes difficult.

Furthermore, in the method in which the piezoelectric substrate is fixed in a piezoelectric substrate accommodating cage-shaped outer trim case by means of a spring piece, there is the fear that the positions of the spring piece and the piezoelectric substrate are dislocated from each other by, for example, vibration impact. When the piezoelectric substrate is brought into contact with the outer trim case, the vibration of the piezoelectric substrate is unfavorably inhibited to an extreme degree.

In Japanese Patent Laid-open Publication No. 55(1980)-100719, a piezoelectric substrate supporting structure is proposed in which a piezoelectric substrate electrode and an electrode coating on a circuit substrate are supported by rubber contact points composed of a conductive rubber to thereby effect communication therebetween. However, in this structure, the rubber contact points per se must be fixed by disposing recesses for burying the rubber contact points in the electrode coating on the circuit substrate or by separately forming a silicon rubber coating on the top of the electrode coating, so that the structure is unfavorably complicated. Further, in this structure, the above rubber contact points prevent realizing a large elastic displacement, to possibly inhibiting the vibration of the piezoelectric substrate. Still further, there is the fear of deterioration of rubber contact points by contact with, for-example, air to thereby unfavorably result in inhibition of the functions of the piezoelectric substrate. In all the above proposals, the vibration produced by the driving of the piezoelectric substrate is propagated to the base plate and the outer trim case to thereby unfavorably cause generation and expansion of audible components of vibration leading to sounding (noisemaking).

SUMMARY OF THE INVENTION

The present invention has been made in view of the above problems. It is an object of the present invention to provide a piezoelectric substrate supporting structure for piezoelectric transformer, which, in the supporting and fixing of a piezoelectric substrate on a base plate or in an outer trim case, does not inhibit the vibration of the piezoelectric substrate, exhibits high impact resistance and enables stable support, is free from performance deterioration and enables simultaneously and easily performing an electrode take-off from the piezoelectric substrate. It is another object of the present invention to provide a piezoelectric transformer including the above piezoelectric substrate supporting structure.

It is a further object of the present invention to provide a piezoelectric substrate supporting structure for piezoelectric transformer, which absorbs and damps the propagated vibration resulting from the driving of the piezoelectric substrate so that the level of sound generated by the propagation to the base plate and outer trim case is reduced, and to provide a piezoelectric transformer including the above piezoelectric substrate supporting structure.

It is still a further object of the present invention to provide a piezoelectric substrate supporting structure for piezoelectric transformer, which enables reducing the number of parts, renders soldering and other working unnecessary and enables reducing the number of assembly steps and to provide a piezoelectric transformer including the above piezoelectric substrate supporting structure.

The present invention has been made with a view toward solving the above prior art problems and attaining the above objects. The piezoelectric substrate supporting structure for piezoelectric transformer,according to the present invention comprises:

a piezoelectric substrate as a constituent of piezoelectric transformer, the piezoelectric substrate having electrodes, and
 conductive supporting members interposed between portions of the electrodes of the piezoelectric substrate and portions of conductive parts disposed on a mounted member for securing the piezoelectric substrate,
 wherein the conductive supporting members are composed of an elastic nonmetal material and a conductive material.

In the piezoelectric substrate supporting structure for piezoelectric transformer according to the present invention, the conductive supporting member may have its internal part or surface provided with cavities.

Also, in the piezoelectric substrate supporting structure for piezoelectric transformer according to the present invention, a section of the conductive supporting member may consist essentially of at least three layers composed of a first resin layer, a conductive layer and a second resin layer arranged in this order from inside toward outside of the conductive supporting member, at least one of the first resin layer and the second resin layer consisting essentially of an elastic material,
 the conductive layer consisting essentially of a conductive material.

Further, in the piezoelectric substrate supporting structure for piezoelectric transformer according to the present invention, the conductive material of the conductive supporting member may consist essentially of a plurality of conductive materials, these conductive materials arranged so as to pass through the conductive supporting member in a direction from portion of electrode of the piezoelectric substrate to portion of conductive part of the mounted member, in which direction the conductive supporting member is interposed between the piezoelectric substrate and the mounted member.

Further, in the piezoelectric substrate supporting structure for piezoelectric transformer according to the present invention, the cavity of the conductive supporting member may be through-hole passing through the conductive supporting member in a direction from portion of electrode of the piezoelectric substrate to portion of conductive part of the mounted member, in which direction the conductive supporting member is interposed between the piezoelectric substrate and the mounted member.

Still further, in the piezoelectric substrate supporting structure for piezoelectric transformer according to the present invention, the cavity of the conductive supporting member may be recess disposed at surfaces of the conductive supporting member.

Still further, in the piezoelectric substrate supporting structure for piezoelectric transformer according to the present invention, the cavity of the conductive supporting member may be cavity disposed in internal part of the conductive supporting member.

Still further, in the piezoelectric substrate supporting structure for piezoelectric transformer according to the present invention, the piezoelectric substrate may be fitted in the mounted member in such a fashion that portion of the electrode of the piezoelectric substrate and portion of conductive part of the mounted member compress the conductive supporting member.

Still further, in the piezoelectric substrate supporting structure for piezoelectric transformer according to the present invention, the mounted member may be a plate for fixing the piezoelectric substrate or an outer trim case for accommodating the piezoelectric substrate. The terminology "plate" used herein means one on which the piezoelectric substrate is mounted, especially, a printed plate or circuit plate having wiring pattern formed thereon.

Still further, in the piezoelectric substrate supporting structure for piezoelectric transformer according to the present invention, the mounted member may be an outer trim case for accommodating the piezoelectric substrate.

The piezoelectric transformer of the present invention comprises the above piezoelectric substrate supporting structure for piezoelectric transformer.

Moreover, according to the present invention, there is provided a piezoelectric inverter comprising the above piezoelectric transformer as a transformer element.

The supporting can be performed at the nodal points of vibration by virtue of the above structuring in the supporting and fixing of the piezoelectric substrate on a base plate or in an outer trim case as the mounted member. Further, the entirety of the conductive supporting member is elastic, so that the vibration of the piezoelectric substrate is not inhibited, excellent impact resistance and stable supporting are ensured, and performance deterioration is minimized.

Especially, in the structure having a cavity in its internal part or at its surface, the cavity permits a large elastic displacement to thereby increase the elasticity. Thus, more effectively, the vibration of the piezoelectric substrate is not inhibited, excellent impact resistance and stable supporting are ensured, and performance deterioration is minimized. Further, an exciting electrode provided on the piezoelectric substrate contacts conductive part of the conductive supporting member with the result that, through this conductive part, electrode takeoff from the piezoelectric substrate can be easily performed. Moreover, the number of assembly parts can be reduced, so that mass productivity enhancement and cost reduction can be attained.

Recesses are formed at the upper and lower surfaces in the conductive supporting member so structured as to have through-holes in the direction from portion of electrode of the piezoelectric substrate, which is point of contact with the supporting member, to portion of conductive part of the mounted member. Thus, dislocation of the conductive supporting member can be prevented by providing protrusions of the size permitting insertion into the recesses, i.e., through-holes on the mounted member or the electrode of the piezoelectric substrate brought into contact with the upper side or lower side of the conductive supporting member. Further, as for the conductive supporting members having the above through-holes, in the securing of the piezoelectric substrate on the mounted member in assembly, a multiplicity of conductive supporting members can be held by, for example, passing a single wire through the through-holes of the conductive supporting members. Moreover, moving of the conductive supporting member to given site can be accomplished only by moving an end of the wire to given position. When the conductive supporting member has no through-holes, the conductive supporting member must be held and moved one by one by the use of separately prepared holding tool. On the contrary, when the through-holes are provided, the apparatus can advantageously be simplified to facilitate automization.

Furthermore, the propagated vibration resulting from the driving of the piezoelectric substrate is absorbed and damped by virtue of the above structuring. Therefore, the level of sound generated by the propagation to the base plate and outer trim case can be reduced. This can very effectively be accomplished by the above structure having through-holes because the area of contact with the piezoelectric substrate is small.

Even when electrode takeoff from the site other than the nodal point of vibration is required in view of the structure of the piezoelectric substrate, the vibration of the piezoelectric substrate is not inhibited, excellent impact resistance and stable supporting can be ensured, and performance deterioration can be avoided.

Further, when an electrode connection is conducted between the conductive supporting member and the piezoelectric substrate, the electrode connection can be carried out only by directly feeding the conductive supporting member and contacting them with each other without the need to separately feed, for example, a soldering material to thereby effect a bonding. Therefore, operating efficiency is improved, and mass productivity can be extremely enhanced.

Still further, the conductive supporting member of the present invention can be inserted in a slightly compressed state between the piezoelectric substrate and the mounted member, so that no dislocation occurs at the time of vibration. Moreover, the conductive supporting member is elastic, so that the impact at mounting of the piezoelectric substrate and the displacement by acceleration can be restricted or absorbed to thereby enable avoiding dislocation at mounting and breakdown of the piezoelectric substrate.

Still further, in the structure having the second resin layer which is a protective layer for preventing deterioration of the conductive part attributed to contact with internal or surface air, the conductive part is free from deterioration and stable vibration of the piezoelectric substrate can be obtained at all times.

DETAILED DESCRIPTION OF PREFERRED EMBODIMENT

Embodiments of the present invention will be described in detail below with reference to the drawings.

Figure 1:
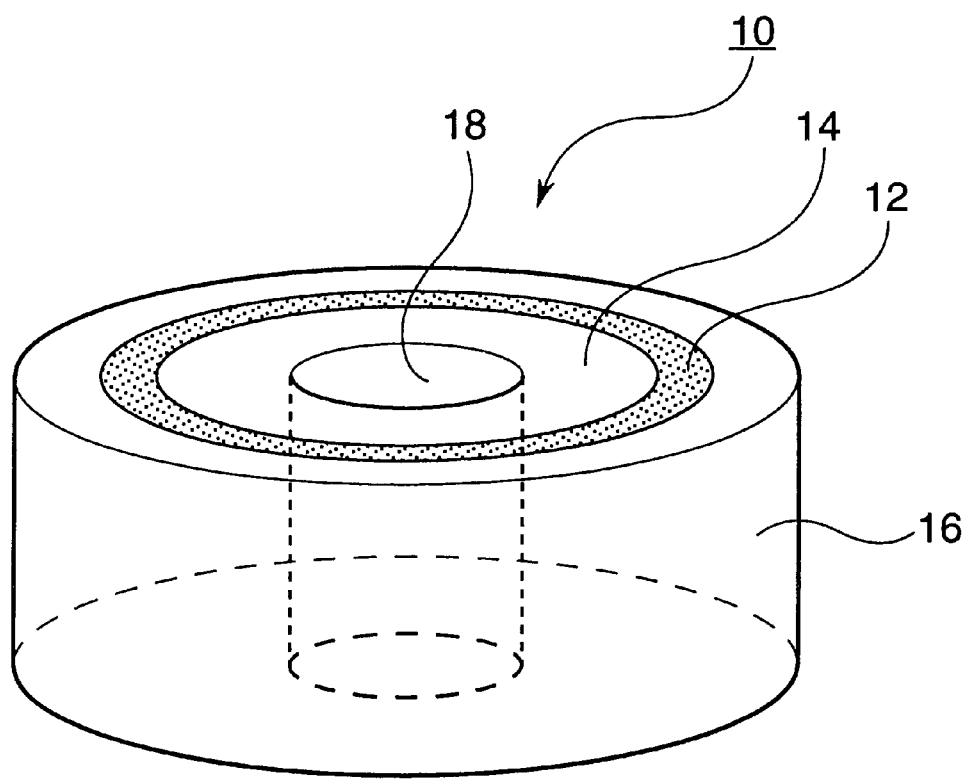
FIG. 1 is a perspective view of a conductive supporting member according to the first embodiment of the present invention.
Figure 2:
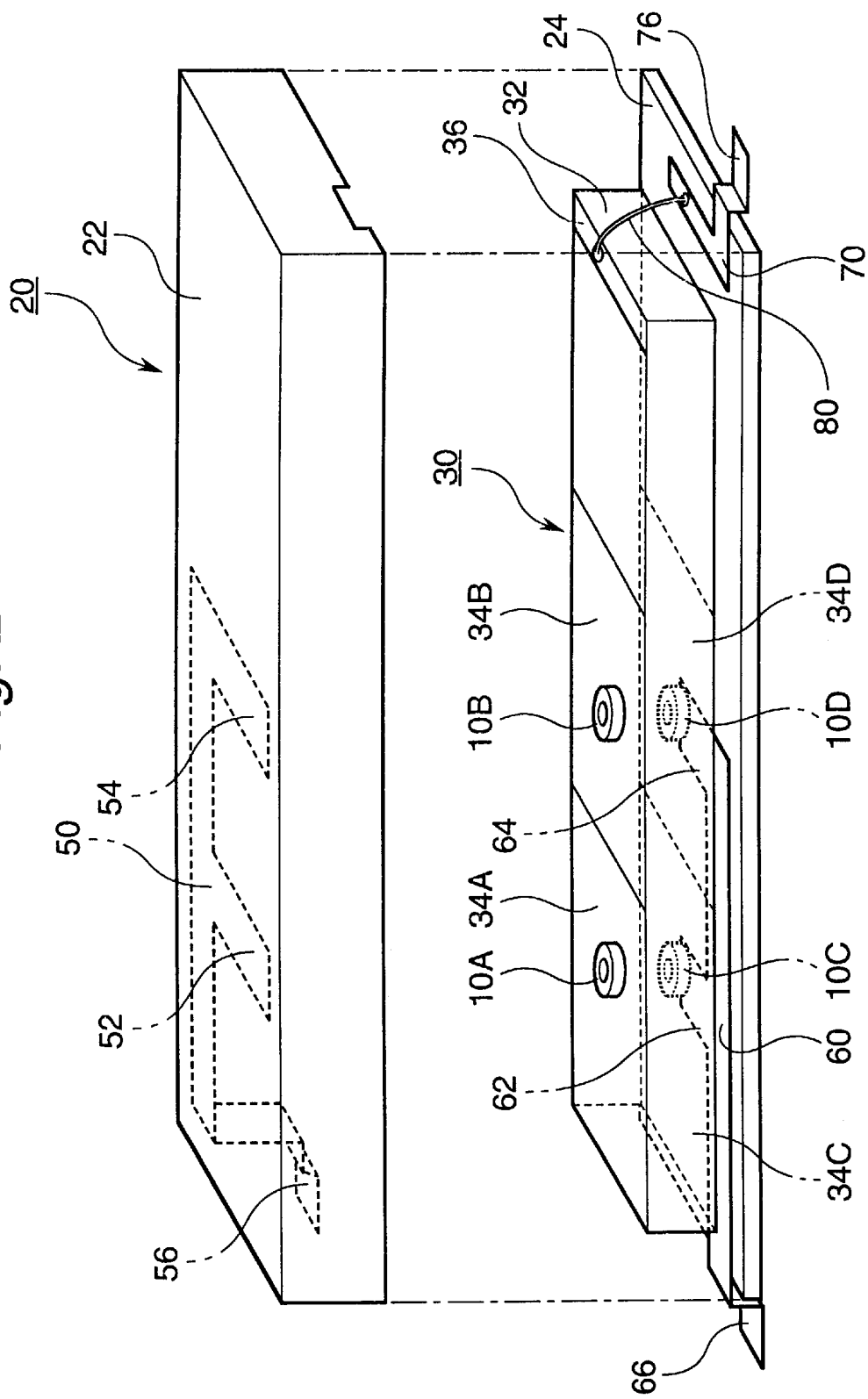
FIG. 2 is an exploded perspective view of a piezoelectric transformer having a piezoelectric substrate assembled therein by the use of the conductive supporting member of the first embodiment of the present invention.
Figure 3:
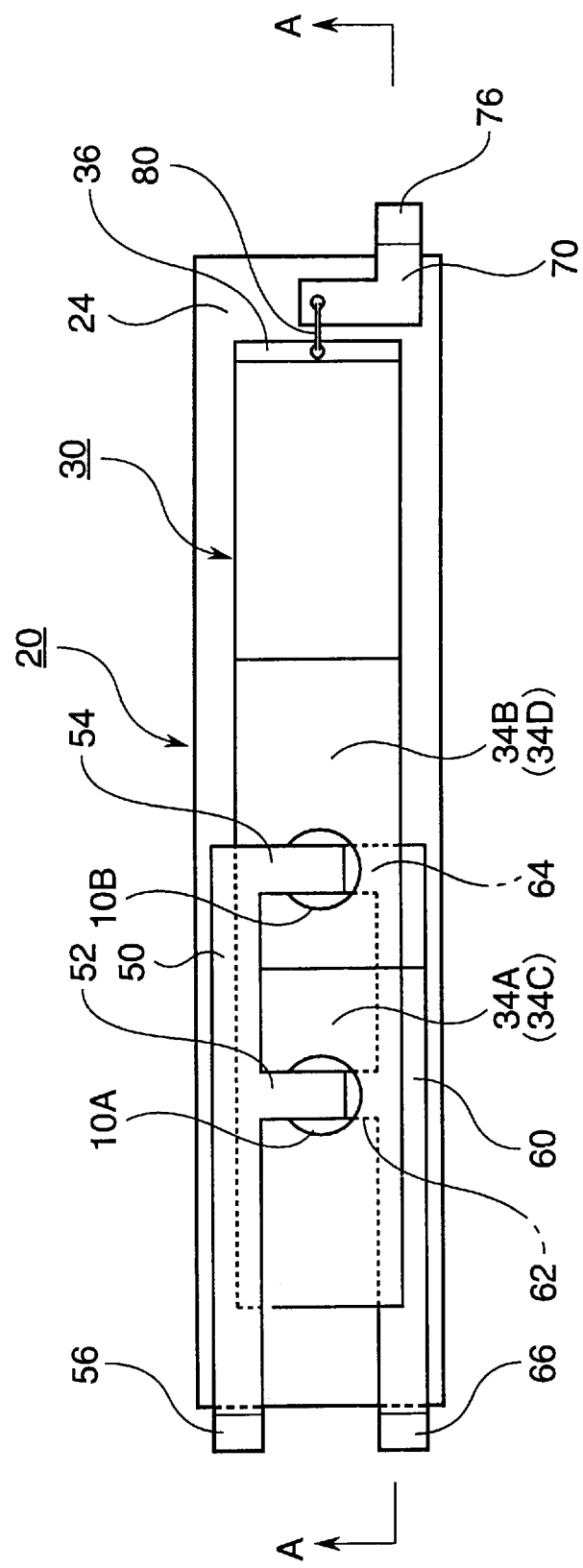
FIG. 3 is a plan view corresponding to FIG. 2.
Figure 4:
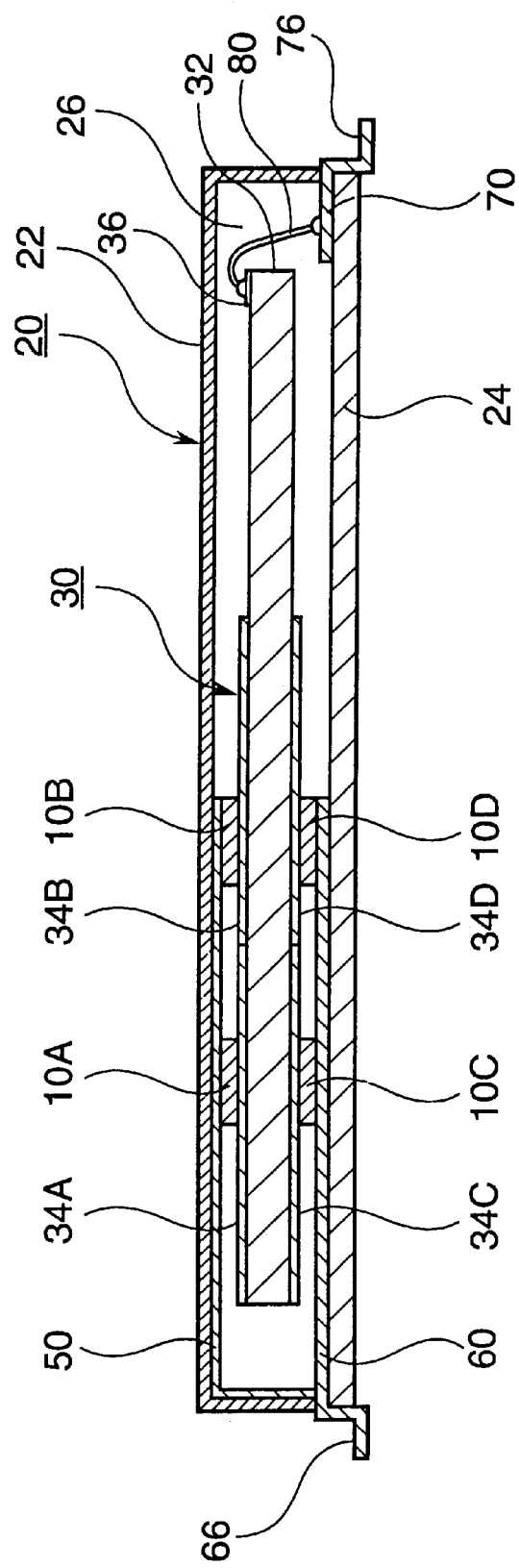
FIG. 4 is a longitudinal section on the line A—A of FIG. 3.
Figure 5:
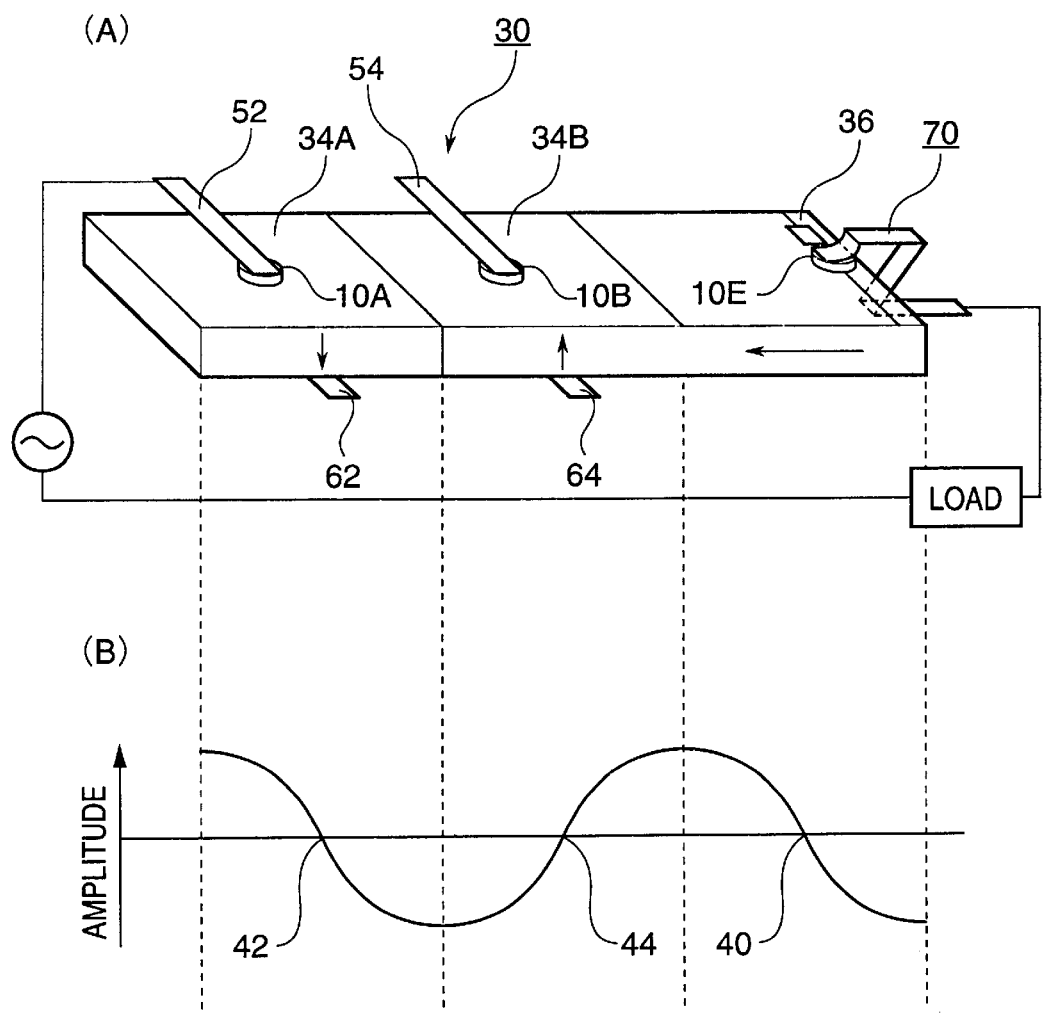
FIG. 5(A) is a schematic circuitry diagram of the piezoelectric transformer of FIG. 2.
FIG. 5(B) is a graph showing the amplitude of the piezoelectric transformer of FIG. 2.

FIG. 1 is a perspective view of a conductive supporting member according to the first embodiment of the present invention; FIG. 2 is an exploded perspective view of a piezoelectric transformer having a piezoelectric substrate assembled therein by the use of the conductive supporting member of the first embodiment of the present invention; FIG. 3 is a plan view corresponding to FIG. 2; FIG. 4 is a longitudinal section on the line A—A of FIG. 3; FIG. 5(A) is a schematic circuitry diagram of the piezoelectric transformer of FIG. 2, and FIG. 5(B) is a graph showing the amplitude of the piezoelectric transformer of FIG. 2.

Referring to FIG. 1, conductive supporting member 10 of the present invention has a cylindrical shape and consists of conductive part 12 which constitutes an annular conductive layer having conductivity and elasticity, internal-boundary-side elastic part 14 which constitutes an annular first resin layer provided on the inside circular surface of the conductive part 12 and having elasticity, and periphery-side insulating protective layer 16 which constitutes a second resin layer provided on the peripheral side of the conductive part 12. The conductive supporting member 10 has hollow part 18 which constitutes a cavity in the center of the internal-boundary-side elastic part 14 and vertically extends therethrough.

For example, EP rubber, butyl rubber, EPDM and urethane can be used as principal materials in the conductive part 12 so that the conductive part 12 possesses elasticity (rubber hardness) capable of supporting and fixing a piezoelectric substrate without inhibiting the vibration of the piezoelectric substrate and without deteriorating the performance thereof. In particular, it is preferred to use silicone rubber from the viewpoint of the wear and abrasion resistance, friction resistance and adherence at the surface of contact with the piezoelectric substrate. With respect to means for imparting the conductivity, this may be implemented by mixing a conductive material into the principal material or by using glass or plastic particles shaped into any of beads, fibers and flakes having the surface thereof coated with a conductive material. These glass or plastic particles may be hollow. Carbon, graphite and metals having conductivity can be used as the conductive material. At least one member may be selected from the above conductive materials and used. Specifically, of them, using any of Ag, Ag—Pd and Au is preferred from the viewpoint of electric conductivity and reliability. Of these, Ag is especially preferred. With respect to the mixing ratio of conductive material to principal material, it is preferred from the viewpoint of elasticity and conductivity that, for example, 55 to 95% by weight of Ag as a conductive material be mixed in the principal material silicone rubber. When the conductive part 12 is formed by mixing Ag into silicone rubber, common shaping methods such as injection or extrusion may be used. Although the thickness of a layer of the conductive part 12 is not particularly limited, it is satisfactory that the thickness fall within the range of 0.05 to 0.3 mm.

The internal-boundary-side elastic part 14 must have elasticity capable of supporting and fixing a piezoelectric substrate without inhibiting the vibration of the piezoelectric substrate and without deteriorating the performance thereof, similar to the conductive part 12. The same material as the principal material of the conductive part 12 can be used for the internal-boundary-side elastic part 14. In particular, using silicone rubber is preferred from the viewpoint of the wear and abrasion resistance, friction resistance, adherence and creep resistance at the surface of contact with the piezoelectric substrate.

This internal-boundary-side elastic part 14 has hollow part 18 in the center thereof, so that a large elastic displacement can be taken in the hollow part with the result that the elasticity is increased. Thus, the vibration of the piezoelectric substrate is not inhibited, the impact resistance is excellent to thereby enable stable support, and the deterioration of the performance can be avoided.

The periphery-side insulating protective layer 16 is provided so as to prevent conductive fillers such as Ag and Pd contained in the conductive part 12 from contacting, for example, air on the peripheral side of the conductive part 12 to thereby undergo oxidation and deterioration. It is preferred that the periphery-side insulating protective layer 16 is formed by silicone rubber coating from the viewpoint of flexibility, weather resistance and creep resistance. Although the thickness of the periphery-side insulating protective layer 16 is not particularly limited, it is satisfactory that the thickness fall within the range of 0.05 to 0.3 mm.

The size of the conductive supporting member 10 of the present invention is not limited as long as the thickness thereof is such that the conductive supporting member 10 in a slightly compressed state can be interposed between the piezoelectric substrate and a mounted member. The thickness of the conductive supporting member 10 is preferably in the range of, for example, 0.3 to 2 mm. For avoiding the inhibition of the vibration of the piezoelectric substrate, the diameter of the conductive supporting member 10 is preferably in the range of 0.5 to 4 mm, still preferably, 1 to 3 mm.

In the preparation of the conductive supporting member 10 with the above structure, first, a silicone rubber tube is extruded to provide the internal-boundary-side elastic part 14. Thereafter, the outer surface of the silicone rubber tube is coated with layers for providing the conductive part 12 and the periphery-side insulating protective layer 16. The resultant continuous hollow tube with the triple layer structure is cut into cylindrical pieces with an appropriate thickness.

By virtue of this structure, the conductive supporting member 10 absorbs and damps the propagated vibration resulting from the driving of the piezoelectric substrate so that the level of sound generated by the propagation to the base plate and outer trim case can be reduced. Further, the conductive supporting member 10 has such a resistance and contact resistance that the performance of the piezoelectric transformer is not deteriorated in an operating input frequency band (10 kHz to several 100 s of kHz) of the piezoelectric substrate.

Figure 7:
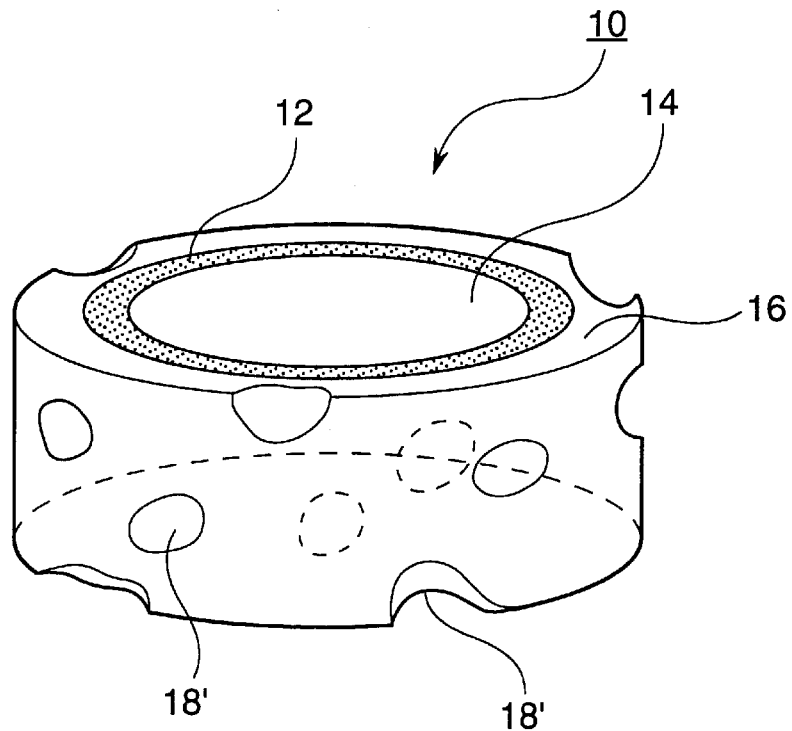
FIG. 7 is a perspective view of a conductive supporting member according to another embodiment of the present invention.

The conductive supporting member 10 may be so structured that, as shown in FIG. 7, the conductive supporting member 10 has a cylindrical shape, the internal-boundary-side elastic part 14 is not provided with the hollow part 18 and a plurality of cavities 18' are disposed at the surface and in the internal part of the periphery-side insulating protective layer 16.

Figure 8:
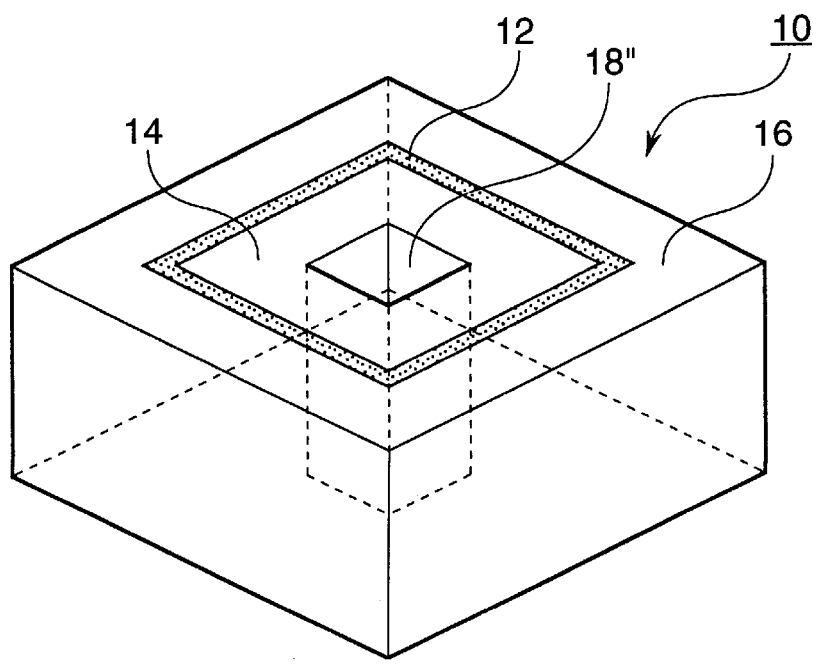
FIG. 8 is a perspective view of a conductive supporting member according to a further other embodiment of the present invention.

Further, the conductive supporting member 10 may be so structured that, as shown in FIG. 8, the conductive supporting member 10 has the shape of a rectangle tube and the internal-boundary-side elastic part 14 at its center is provided with a hollow part 18" having the shape of a rectangle tube. Still further, as an application of FIG. 8, the conductive supporting member 10 can be shaped into a triangle tube, a polygon tube or other desired morphology. In this embodiment, although only one hollow part 18" is formed, the internal-boundary-side elastic part 14 can naturally be provided with a multiplicity of hollow parts 18"'.

The conductive supporting member 10 at its surface and in the internal part thereof can be provided with the cavities by the following methods.

In the first method, as in the above method, an elastic resin is shaped into a column for providing the internal-boundary-side elastic part 14, and coatings for providing the conductive part 12 and the periphery-side insulating protective layer 16 are applied to the outer surface of the column. Thus, the conductive supporting member 10 is obtained. In this method, recesses and cavities can be provided by mixing a blowing agent in a molding material for the internal-boundary-side elastic part 14 and, without forming the hollow part 18, producing blown gas by evaporation in the shaping stage to thereby form cavities (voids) in the internal part of the internal-boundary-side elastic part 14. The conductive supporting member 10 having cavities (voids) in its internal part can be obtained by application of coatings for providing the conductive part 12 and the periphery-side insulating protective layer 16 to the outer surface of the internal-boundary-side elastic part 14. As long as conductivity is ensured, the conductive part 12 may partially be broken off at its cavities.

In the second method, periphery-side insulating protective layer 16 is shaped in the form of a tube and coatings for providing the conductive part 12 and the internal-boundary-side elastic part 14 in this order is applied to its internal surface and whereby the conductive supporting member 10 is obtained. In this method, the hollow part 18 can be formed in the core part of the conductive supporting member 10. The presence of the hollow part 18 enables taking a large elastic displacement.

In the third method, a blowing agent is mixed in a molding material for the periphery-side insulating protective layer 16, and blown gas is produced by evaporation in the shaping stage. Thus, recesses can be formed at the surface of the periphery-side insulating protective layer 16, and cavities (voids) can be formed in the internal part thereof.

The interposition of the conductive part 12 between the internal-boundary-side elastic part 14 and the periphery-side insulating protective layer 16 enables not only preventing the conductive part 12 subjected to repeated vibrations from being peeled from the internal-boundary-side elastic part 14 and the periphery-side insulating protective layer 16 but also avoiding the contact of the conductive part 12 with outside air to thereby prevent the deterioration caused by the contact with outside air. In all the above methods, naturally, the hollow part 18 and the recesses or cavities can coexist in the core part of the conductive supporting member 10.

In this embodiment, although the conductive supporting member 10 has been formed from the conductive part 12, the internal-boundary-side elastic part 14 and the periphery-side insulating protective layer 16, the conductive supporting member 10 can naturally be formed from a multilayer structure which is a laminate of the periphery-side insulating protective layer 16, the conductive part 12 and the internal-boundary-side elastic part 14. Moreover, although it is desired that the conductive part 12 be composed of a layer which is continuous in the form of a ring, the conductive part 12 may be composed of a discontinuous layer which is cut in the circumferential direction.

The first embodiment in which the above structured conductive supporting member 10 is applied to a piezoelectric transformer having a piezoelectric substrate assembled therein will be described below with reference to FIGS. 2 to 5.

The conductive supporting member 10 of the present invention can be applied to not only the piezoelectric transformer but also other piezoelectric parts utilizing resonance vibrations, such as a piezoelectric gyro, a piezoelectric buzzer and a piezoelectric actuator (not shown). However, for the convenience of explanation, the following description will be made with respect to the application to the piezoelectric transformer.

Referring to FIGS. 2 to 4, numeral 20 denotes the entirety of a piezoelectric transformer as a piezoelectric part of the present invention. The piezoelectric transformer 20 has a pair of outer trim cases vertically arranged, i.e., upper outer trim case 22 and lower outer trim case 24. The upper outer trim case 22 and the lower outer trim case 24 at edges thereof are respectively provided with engaging protrusions and engaging holes (not shown), by which the outer trim cases can be engaged with each other and fixed. Rectangular piezoelectric substrate 30 is inserted in accommodating part 26 defined by the upper outer trim case 22 and the lower outer trim case 24.

As for the piezoelectric substrate 30, piezoelectric transformer of polarization inversion Rosen type which comprises piezoelectric plate 32 composed of a piezoelectric ceramic and, provided on the surface thereof by, for example, screen printing, silver electrodes is used. Specifically, the upper and lower surfaces of the piezoelectric substrate 30 are provided with a total of 4 input electrodes, i.e., input electrodes 34A to 34D. In FIG. 2, output electrode 36 is provided on a right-side upper edge of the piezoelectric substrate 30. This piezoelectric substrate 30 is polarized in advance in the arrowed direction shown in FIG. 5(A). When alternating current input voltages are applied between electrode 34A and electrode 34C and between electrode 34B and electrode 34D, piezoelectric vibration is generated. Power converted voltage occurs on the output side, which is taken out from the output electrode 36.

Although the piezoelectric transformer of polarization inversion Rosen type is described in this Embodiment by way of example, naturally, the present invention is applicable to other piezoelectric transformers of all types, such as piezoelectric transformer of Rosen type and piezoelectric transformer of object third-order Rosen type.

The piezoelectric transformer transfers energy by mechanical vibration. Therefore, the piezoelectric transformer (piezoelectric substrate 30) must include a support such that, in the driving of the piezoelectric transformer, the mechanical vibration excited by piezoelectric effect is not inhibited. The mechanical vibration of the piezoelectric substrate 30 is in a standing wave mode and, as shown in FIG. 5(B), there are nodal points of vibration 40, 42, 44. When supporting is effected at these vibration nodal point portions, the inhibition of the mechanical vibration of the piezoelectric substrate 30 can be minimized.

Therefore, in the piezoelectric transformer 20 of the present invention, conductive supporting members 10 are arranged at the above nodal point 42, 44 portions. Specifically, the inside of the upper outer trim case 22 is fitted with a lead terminal 50 composed of a conductive metal such as copper. Contact point portions 52, 54 are positioned at portions of the lead terminal 50 corresponding to the nodal point 42, 44 portions. Likewise, the inside of the lower outer trim case 24 is fitted with a lead terminal 60, and contact point portions 62, 64 are positioned at portions of the lead terminal 60 corresponding to the nodal point 42, 44 portions. Numerals 56, 66 denote lead terminal 50, 60 takeoff connections, respectively. The fitting of the lead terminals 50, 60 on the outer trim cases 22, 24 may be performed by bonding with an adhesive, fusion, insertion, caulking or one-piece molding and may also be performed by plating. Furthermore, the lead terminals 50, 60 may be provided by constituting part of the outer trim case by a conductive material.

Conductive supporting members 10A, 10B are respectively disposed between the contact point portions 52, 54 of the lead terminal 50 and portions of the input electrodes 34A and 34B of the piezoelectric substrate 30 corresponding to the nodal point 42, 44 portions. Likewise, conductive supporting members 10C, 10D are respectively disposed between the contact point portions 62, 64 of the lead terminal 60 and portions of the input electrodes 34C and 34D of the piezoelectric substrate 30 corresponding to the nodal point 42, 44 portions. As a result, not only is the piezoelectric substrate 30 supported and fixed but also electrode takeoff can be conducted.

On the other hand, the output electrode 36 of the piezoelectric substrate 30 is connected to lead terminal 70 disposed on a right-side edge of the lower outer trim case 24 by soldering lead wire 80, thereby enabling takeoff (76) outside the outer trim case. The lead wire 80 is not necessarily required to support the piezoelectric substrate 30, so that a lead wire which does not inhibit vibration and has low rigidity, such as a slender stranded wire, can be used. As shown in FIG. 5(A), naturally, conductive supporting member 10E can be arranged on this output electrode 36 by disposing lead terminal 70 so as to extend in the Z shape, thereby effecting support.

Although not shown, it is naturally feasible to perforate the outer trim case and to draw the conductive supporting member 10 outside the outer trim case. Further, although the number of steps is increased, it is also naturally feasible to fix the conductive supporting member 10 with the use of an adhesive.

The above piezoelectric transformer 20 can be manufactured by the following method. In the first method, the conductive supporting members 10 are fixed on the piezoelectric substrate 30 and thereafter assembly is conducted. In the second method, the conductive supporting members 10 are fixed on the upper and lower outer trim cases 22, 24 and thereafter an assembly is conducted so as to interpose the piezoelectric substrate 30 therebetween. In the third method, the upper outer trim case 22 or lower outer trim case 24, conductive supporting members 10, piezoelectric substrate 30, conductive supporting members 10 and lower outer trim case 24 or upper outer trim case 22 are assembled in that order.

The second Embodiment in which a piezoelectric substrate as a transformer is mounted on a circuit substrate such as an inverter with the use of the conductive supporting member 10 of the present invention will be described below with reference to FIG. 6.

Figure 6:
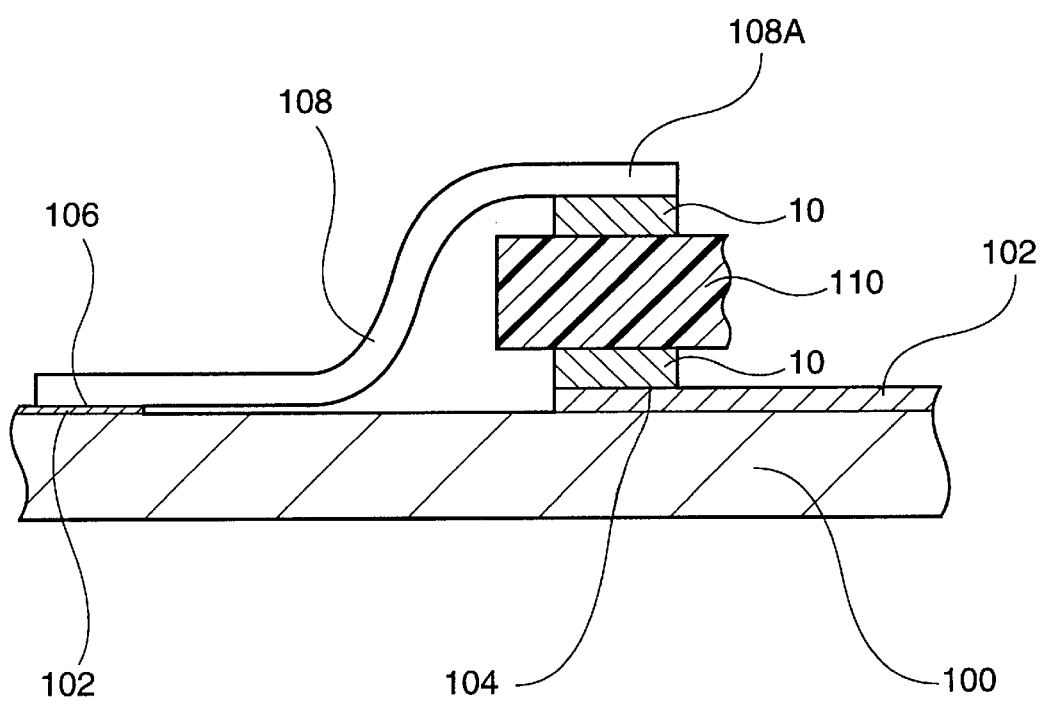
FIG. 6 is an enlarged schematic view of a surface of circuit substrate copper pattern lead portion according to the second embodiment of the present invention, having a piezoelectric substrate as a transformer mounted on a circuit substrate such as an inverter with the use of the conductive supporting member of the present invention.

FIG. 6 is an enlarged schematic view of a surface of circuit substrate copper pattern lead portion.

Figure 16:
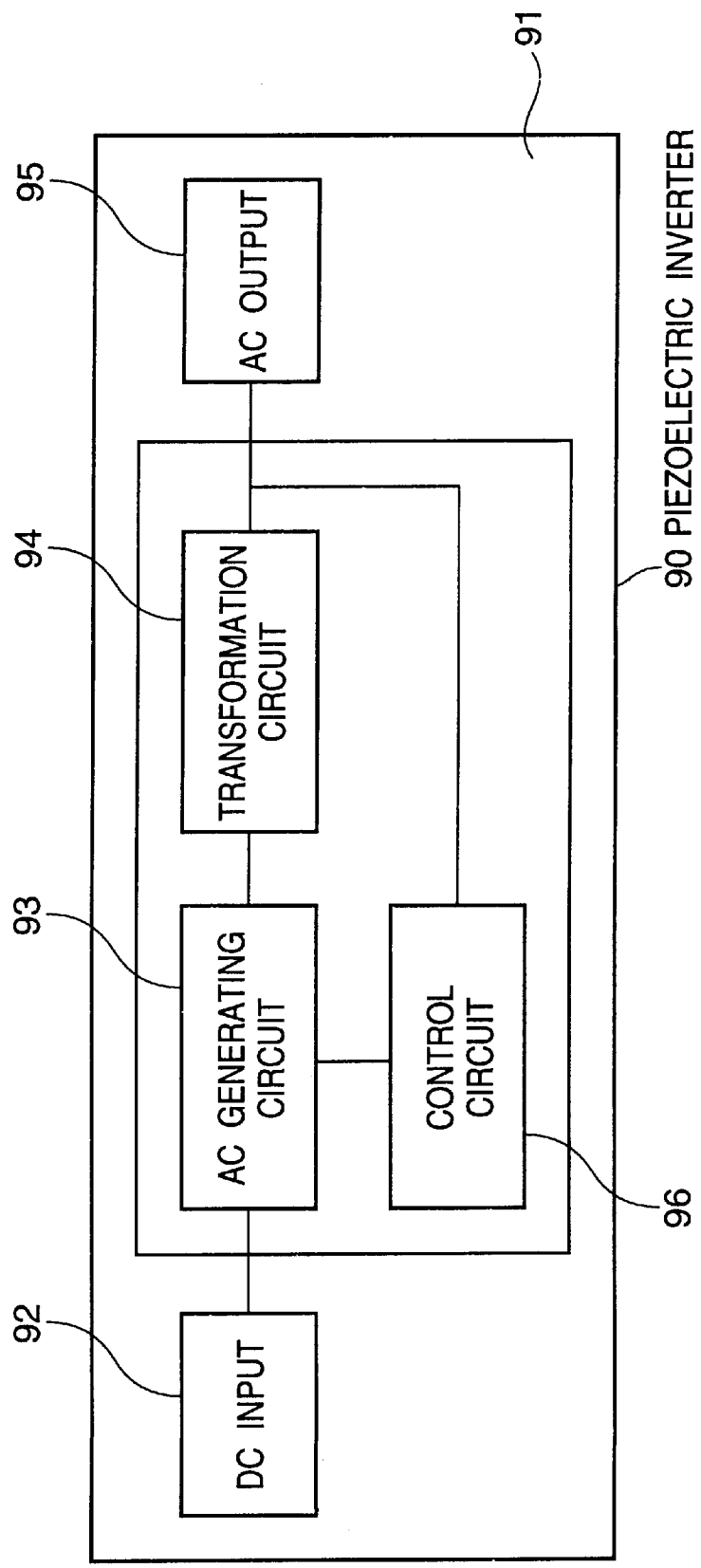
FIG. 16 is a view showing the system of a piezoelectric inverter.

Referring to the FIG. 16 view showing the system of a piezoelectric inverter, piezoelectric inverter 90 comprises circuit plate 91 and, superimposed thereon, DC input 92, AC generating circuit 93 capable of converting direct current inputted through the DC input 92 to alternating current, transformation circuit 94 composed of a piezoelectric transformer capable of changing the voltage of alternating current from the AC generating circuit 93, control circuit 96 capable of controlling these and AC output 95 capable of outputting alternating current outputted from the transformation circuit 94. The piezoelectric substrate is used as a piezoelectric transformer by the use of the conductive supporting member 10 of the present invention in the above transformation circuit 94. As shown in FIG. 6, numeral 100 denotes a circuit plate, and copper pattern circuit 102 is formed on the surface of the circuit plate 100. Bent terminal 108 soldered to contact point portion 106 of other copper pattern circuit 102 is arranged above contact point portion 104 of the copper pattern circuit 102. Thus, the structure is obtained in which the piezoelectric substrate 110 is elastically supported between the contact point portion 104 of the copper pattern circuit 102 and front edge portion 108A of the terminal 108 by means of the conductive supporting member 10.

This structuring enables directly mounting onto the circuit plate and enables avoiding the upper and lower outer trim cases and electrode terminals needed in the first Embodiment, so that cost reduction, part thickness reduction (height decrease) and miniaturization can be attained.

In this structuring as well, not only piezoelectric transformer of polarization inversion Rosen type but also other piezoelectric transformers such as piezoelectric transformer of Rosen type and piezoelectric transformer of object third-order Rosen type can be used as the piezoelectric transformer. Further, although the number of steps is increased, it is also naturally feasible to fix the conductive supporting member with the use of an adhesive.

Figure 9:
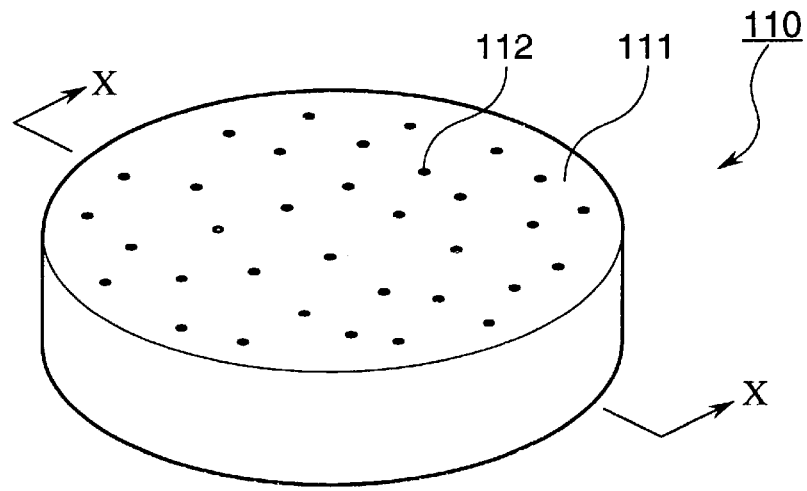
FIG. 9 is a perspective view of another embodiment of conductive supporting member according to the present invention.
Figure 10:
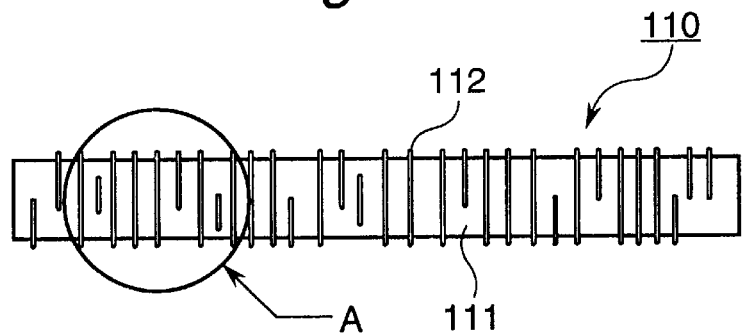
FIG. 10 is a longitudinal section on the line X—X of FIG. 9.
Figure 11:
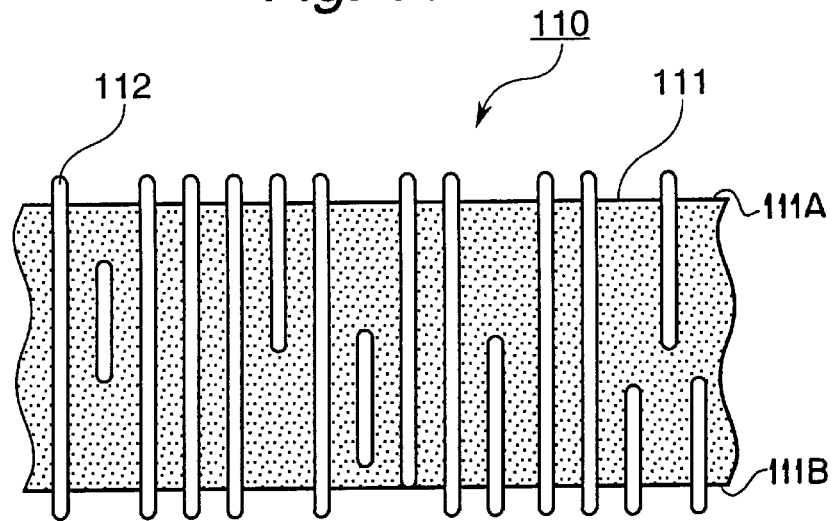
FIG. 11 is an enlarged longitudinal sectional view of portion A of FIG. 10.

FIG. 9 is a perspective view of another embodiment of conductive supporting member according to the present invention. FIG. 10 is a longitudinal section on the line X—X of FIG. 9. FIG. 11 is an enlarged longitudinal sectional view of portion A of FIG. 10.

This conductive supporting member 110 comprises silicone rubber part 111, which has a cylindrical shape, is nonadherent and has elasticity, and conductive part 112 composed of metal fibers buried in the silicone rubber part 111. As shown in FIG. 10 and FIG. 11, this conductive part 112 at least contains metal fibers passing through the silicone rubber part 111 from upper surface 111A to lower surface 111B thereof. By this construction, electric communication can be conducted in the vertical direction of the conductive supporting member 110, i.e., the direction from portion of electrode of the piezoelectric substrate to portion of conductive part of the mounted member, in which direction the conductive supporting member is interposed between the piezoelectric substrate and a mounted member.

For example, "SHINETSU INTERCONNECTOR MAF TYPE" (trade name, produced by Shinetsu Polymer Kabushiki Kaisha) can be used as the above conductive supporting member 110.

Figure 12:
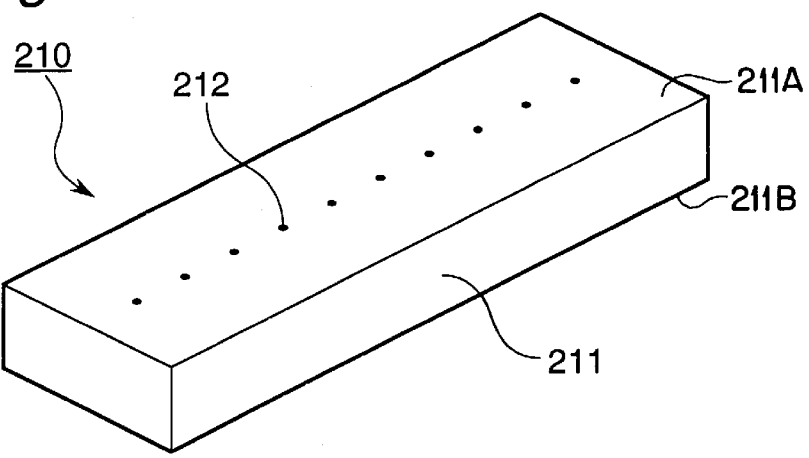
FIG. 12 is a perspective view of a further other embodiment of conductive supporting member according to the present invention.
Figure 13:
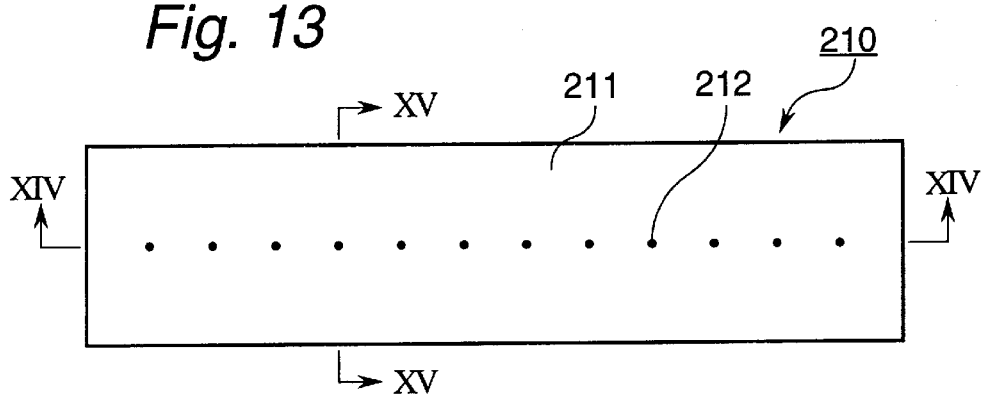
FIG. 13 is a plan view of the conductive supporting member of FIG. 12.
Figure 14:
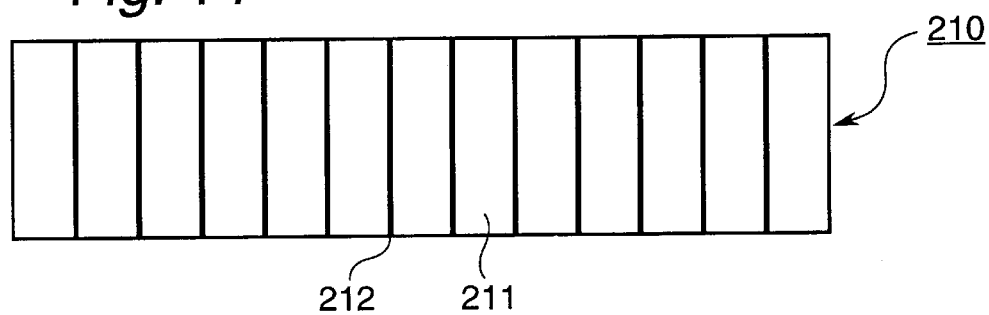
FIG. 14 is a longitudinal section on the line XIV—XIV of FIG. 13.
Figure 15:
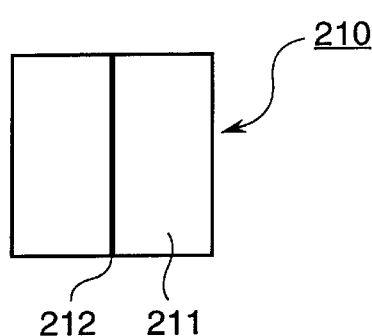
FIG. 15 is a longitudinal section on the line XV—XV of FIG. 13.

FIG. 12 is a perspective view of a further other embodiment of conductive supporting member according to the present invention. FIG. 13 is a plan view of the conductive supporting member of FIG. 12. FIG. 14 is a longitudinal section on the line XIV—XIV of FIG. 13. FIG. 15 is a longitudinal section on the line XV—XV of FIG. 13.

This conductive supporting member 210 comprises silicone rubber part 211, which has the shape of rectangular parallelepiped, is nonadherent and has elasticity, and conductive part 212 composed of metal fibers buried in the silicone rubber part 211. As shown in FIG. 13 and FIG. 14, this conductive part 212 contains metal fibers passing through the silicone rubber part 211 from upper surface 211A to lower surface 211B thereof, which metal fibers are arranged with given intervals on a central line of the silicone rubber part 211. By the conductive part 212, a structuring is made such that electric communication can be conducted in the vertical direction of the conductive supporting member 210, i.e., the direction from portion of electrode of the piezoelectric substrate to portion of conductive part of the mounted member, in which direction the conductive supporting member is interposed between the piezoelectric substrate and a mounted member.

With respect to the arrangement of the metal fibers, the metal fibers can be disposed randomly or on a plurality of lines in place of the above arrangement on a line with given intervals.

For example, "FUJI POLYCONNECTOR FL-LS" (trade name, produced by Fuji Kobunshi Kogyo Kabushiki Kaisha) can be used as the above conductive supporting member 210.

Although not shown, it is also naturally feasible to increase the elasticity by disposing cavities as shown in FIG. 1 or FIG. 7 in the silicone rubber portion of the above FIG. 9 or FIG. 12 form of conductive supporting member.

What is claimed is:

1. A piezoelectric substrate supporting structure for a piezoelectric transformer, comprising:

a piezoelectric substrate having electrodes; and a conductive supporting member for supporting the piezoelectric substrate to a mounting member;

one end of the conductive supporting member being contacted to the electrode formed on the surface of the piezoelectric substrate, the other end of the conductive supporting member being contacted to a conductive member formed on the surface of the mounting member, said conducting supporting member comprising an elastic nonmetal material and a conductive material, a section of the conductive supporting member consisting essentially of at least three layers composed of a first resin layer, a conductive layer and a second resin layer arranged in this order from an inside toward an outside of the conducting supporting member, at least one of the first resin layer and the second resin layer comprising an elastic material, and the conductive layer comprising a conductive material, said first resin layer comprising a through-hole passing through in the vertical direction from the piezoelectric substrate to the mounting layer.

2. The piezoelectric substrate supporting structure as claimed in claim 1, wherein the piezoelectric substrate is fitted in the mounted member so that a portion of the electrode of the piezoelectric substrate and a portion of conductive part of the mounted member compress the conductive supporting member.

3. The piezoelectric substrate supporting structure as claimed in claim 1, wherein the mounted member is a plate for fixing the piezoelectric substrate.

4. The piezoelectric substrate supporting structure as claimed in claim 1, wherein the mounted member is an outer trim case for accommodating the piezoelectric substrate.

5. A piezoelectric transformer comprising the piezoelectric substrate supporting structure for the piezoelectric transformer as claimed in claim 1.

6. A piezoelectric inverter comprising the piezoelectric transformer as claimed in claim 5.

* * * * *